United States Patent [19]

Takahashi et al.

[11] Patent Number: 4,642,283
[45] Date of Patent: Feb. 10, 1987

[54] PLATE MAKING PROCESSING FOR USING NEGATIVE WORKING LIGHT-SENSITIVE LITHOGRAPHIC PLATE REQUIRING NO DAMPENING SOLUTION

[75] Inventors: Hiroshi Takahashi; Yasuhisa Narutomi; Yoshimasa Aotani; Keisuke Shiba, all of Kanagawa, Japan

[73] Assignee: Fuji Photo Film Co., Ltd., Kanagawa, Japan

[21] Appl. No.: 711,861

[22] Filed: Mar. 14, 1985

[30] Foreign Application Priority Data

Mar. 14, 1984 [JP] Japan ................................ 59-48307

[51] Int. Cl.$^4$ ............................................. G03F 7/08
[52] U.S. Cl. .................................... 430/303; 430/145; 430/147; 430/180; 430/182; 430/191; 430/300
[58] Field of Search ............... 430/303, 302, 191, 180, 430/145, 147, 182, 300

[56] References Cited

U.S. PATENT DOCUMENTS

| | | | |
|---|---|---|---|
| 2,551,133 | 5/1951 | Jennings et al. | 430/180 |
| 2,974,042 | 3/1961 | Sus et al. | 430/191 |
| 3,086,861 | 4/1963 | Woitach et al. | 430/191 |
| 3,149,972 | 9/1964 | Herrick et al. | 430/180 |
| 3,373,021 | 3/1968 | Adams et al. | 430/302 |
| 3,404,005 | 10/1968 | Tobey | 430/191 |
| 3,933,495 | 1/1976 | Kondo et al. | 430/303 |
| 4,108,664 | 8/1978 | de Boer et al. | 430/191 |
| 4,496,647 | 1/1985 | Kawabe et al. | 430/303 |

FOREIGN PATENT DOCUMENTS 100938  7/1983  European Pat. Off. .

Primary Examiner—Charles L. Bowers, Jr.
Attorney, Agent, or Firm—Sughrue, Mion, Zinn, Macpeak, and Seas

[57] ABSTRACT

A negative working light-sensitive lithographic plate requiring no dampening solution and a plate making process are described, the negative working light-sensitive lithographic plate comprising a support having, in sequence, on said support, (A) a light-sensitive layer containing (1) an o-quinonediazide compound and (2) a coupling component which causes a diazo coupling reaction under a basic environment, and (B) a silicone rubber layer, and the plate making process comprising imagewise exposing the negative working light-sensitive lithographic plate and developing said exposed plate to obtain a lithographic plate requiring no dampening solution, wherein a step of processing with base is carried out after imagewise exposure.

6 Claims, No Drawings

PLATE MAKING PROCESSING FOR USING NEGATIVE WORKING LIGHT-SENSITIVE LITHOGRAPHIC PLATE REQUIRING NO DAMPENING SOLUTION

FIELD OF THE INVENTION

The present invention relates to a negative working light-sensitive lithographic plate requiring no dampening solution (hereinafter called "negative working dry PS plate") and a plate making process. In greater detail, it relates to a plate making process which comprises imagewise exposing a negative working dry PS plate, which comprises a support, a light-sensitive layer containing an o-quinonediazide compound and a coupling component which causes a diazo coupling reaction with the o-quinonediazide compound under a basic environment, and a silicone rubber layer provided on said layer, and, thereafter, treating the plate with base and developing the plate.

BACKGROUND OF THE INVENTION

Japanese Patent Publication No. 16044/71 (corresponding to U.S. Pat. No. 3,511,178) teaches a dry PS plate, which comprises a silicone rubber layer provided through an adhesive layer on a light solubilizable diazo light-sensitive layer backed with an aluminum plate, and which is exposed to light through a negative film, and thereafter the solubilized light-sensitive layer is removed by dissolution with a developing solution simultaneously with removing the silicone rubber layer provided on said layer, by which the aluminum plate is exposed to form an image part.

Japanese Patent Application (OPI) Nos. 80046/81 (corresponding to U.S. Pat. No. 4,342,820), 110249/80 (corresponding to British Pat. No. 2,034,911) and 59466/80 (corresponding to U.S. Pat. No. 4,358,522), teach a negative working dry PS plate, which comprises a silicone rubber layer provided on a light-sensitive layer composed of an o-quinonediazide compound supported by a base, and which is exposed to light through a negative transparency, and then the silicone rubber layer of the exposed part and, if necessary, the light-sensitive layer of the exposed part are removed with a developing solution, by which the light-sensitive layer or, if necessary, the support is exposed to form an image part (the term "OPI" as used herein refers to a "published unexamined Japanese patent application").

However, in these negative working dry PS plate, since only the silicone rubber layer in the exposed part or both the silicone rubber layer and the light-sensitive layer are removed by development to form an image part, while the silicone rubber layer in the non-exposed part is allowed to remain after development to form a non-image part, by which a lithographic plate requiring no dampening solution is produced, the light-sensitive layer of the non-image part (namely, the non-exposed part) has light sensitivity after development processing. As a result, and it is exposed by sunlight or fluorescent lamps in the room. In addition, the printing plate has an opportunity to be contacted with organic solvents analogous to the solvent for development, for example, with a plate cleaner or a printing ink in the printing step. In such a case, if good image reproduction is attained in the development step, there is an essential fault that the silicone rubber layer of the non-image part comes off by corrosion with the organic solvents when the light-sensitive layer is subjected to re-exposure.

In order to solve such a problem, processes which comprise fixing a negative working dry PS plate by thermal treatment after it is exposed to light and developed (Japanese Patent Application (OPI) Nos. 60947/80 and 192956/82) have been proposed. However, processes described in these Japanese Patent Applications have disadvantages in that they require an apparatus for thermal treatment and it is still not possible to completely prevent the silicone rubber layer from coming off of the non-image part because fixation of the non-image part is insufficient under such a thermal treatment condition. Japanese Patent Application (OPI) No. 205740/82 discloses a process which comprises fixing by processing with base after exposure and development, but it is understood that sufficient fixation of the non-image part is not attained by such a process.

Further, Japanese Patent Application (OPI) No. 17552/84 discloses a negative working dry PS plate, which comprises a light-sensitive layer containing an o-quinonediazide compound and a carboxylic acid, and which is imagewise exposed and developed after processing with a base or processed with a developing solution containing a base, by which the development latitude expands and, at the same time, the non-image part is fixed. However, in this case, it is understood that satisfactory fixation cannot be sufficiently carried out.

SUMMARY OF THE INVENTION

An object of the present invention is to provide a negative working dry PS plate capable of forming a lithographic printing plate requiring no dampening solution in which the non-image part is satisfactorily fixed.

Another object of the present invention is to provide a plate making process by which a lithographic printing plate requiring no dampening solution having a completely fixed non-image part can be obtained by a simple processing.

As a result of various studies, the present inventors have found that the above-described objects are attained by a negative working dry PS plate having, in sequence, a light-sensitive layer and a silicone rubber layer on a support, when said light-sensitive layer contains (1) a compound having an o-quinonediazide structure as a constituent and (2) a coupling component which causes a diazo coupling reaction under a basic environment. Namely, the present invention relates to a negative working dry PS plate which comprises a support, a light-sensitive layer containing an o-quinonediazide compound and a coupling component which causes a diazo coupling reaction with the o-quinonediazide compound under a basic environment and a silicone rubber layer provided on said layer, and a plate making process which comprises imagewise exposing said PS plate and developing it to obtain a lithographic printing plate requiring no dampening solution, wherein a step of processing with base is carried out after imagewise exposure.

DETAILED DESCRIPTION OF THE INVENTION

The light-sensitive layer in the present invention is composed of a known compound having an o-quinonediazide structure. The compound having an o-quinonediazide structure is any o-quinonediazide compound normally used for positive working PS plates, wipe-on plates and photoresists, etc.

Such o-quinonediazides may be polymers, oligomers or monomers, which are o-quinonediazidosulfonic acid esters obtained by condensation reaction with a hydroxyl group containing compound or o-quinonediazidosulfonic acid amides obtained by condensing with an amine.

Examples of them include esters of benzoquinone-1,2-diazidosulfonic acid or naphthoquinone-1,2-diazidosulfonic acid and polyhydroxyphenyl (hereinafter, the term: ester includes partial ester), esters of naphthoquinone-1,2-diazido-4-sulfonic acid or naphthoquinone-1,2-diazido-5-sulfonic acid and pyrogallol-acetone resin, esters of benzoquinone-1,2-diazidosulfonic acid or naphthoquinone-1,2-diazidosulfonic acid and novolak type phenol-formaldehyde resin or novolak type cresol-formaldehyde resin, amides of poly(p-aminostyrene) and naphthoquinone-1,2-diazido-4-sulfonic acid or naphthoquinone-1,2-diazido-5-sulfonic acid, esters of poly-p-hydroxystyrene and naphthoquinone-1,2-diazido-4-sulfonic acid or naphthoquinone-1,2-diazido-5-sulfonic acid, esters of polyethylene glycol and naphthoquinone-1,2-diazido-4-sulfonic acid or naphthoquinone-1,2-diazido-5-sulfonic acid, amides of polymer amine and naphthoquinone-1,2-diazido-4-sulfonic acid or naphthoquinone-1,2-diazido-5-sulfonic acid, esters of polymethacrylic acid p-hydroxyanilide and naphthoquinone-1,2-diazido-4-sulfonic acid or naphthoquinone-1,2-diazido-5-sulfonic acid, amides of amine modified natural rosin and naphthoquinone-1,2-diazido-5-sulfonic acid, esters of epoxy resin composed of bisphenol A and propylene oxide and naphthoquinone-1,2-diazido-5-sulfonic acid, esters of a polymer composed of monoester of acrylic (methacrylic) acid and dihydroxyphenyl and naphthoquinone-1,2-diazido-4-sulfonic acid or naphthoquinone-1,2-diazido-5-sulfonic acid, polymerized products of a condensate composed of aminoisophthalic acid diallyl ester and naphthoquinonediazidosulfonic acid, products obtained by cross-linking a quinonediazidosulfonic acid ester of polycarbonate or quinonediazides with isocyanates, esters of bisphenol A and naphthoquinone-1,2-diazido-4-sulfonic acid or naphthoquinone-1,2-diazido-5-sulfonic acid, esters of naphthoquinone-1,2-diazido-5-sulfonic acid and phenols such as phenol or p-cresol, etc., or alcohols such as ethyl, propyl, butyl or amyl alcohol, etc., and acid amides of naphthoquinone-1,2-diazido-5-sulfonic acid and amines such as aniline or p-hydroxyaniline, etc. Particularly, o-quinonediazide type light-sensitive resins are suitably used.

The amount of the o-quinonediazides used in the present invention is 30 to 95 wt%, preferably 50 to 90 wt%, based on the total weight of the light-sensitive layer.

As the coupling components contained in the light-sensitive layer in the present invention, which cause a diazo coupling reaction under a basic environment, any couplers used generally for diazo type processes (diazocopy), for example, compounds described in J. Kosar, Light-Sensitive Systems, John Wiley & Sons (1965), pages 215–249, can be used. Those having moderately low solubility in the developing solution (namely, those which are neither easily soluble nor insoluble) are preferred. Further, those having high coupling reactivity under a basic environment with diazo compounds are preferred.

Generally, couplers composed of pyrazolone, hydroxypyridone, pyrone, acetonitrile or diketone derivatives are useful, because they have high reactivity.

In the present invention, particularly suitable coupling components are polymers having the above-described coupler residue in side chains. Such coupling components show effective fixing function because they cause cross-linking to become insoluble by a diazo coupling reaction. Suitable groups of such polymers are copolymers composed of (a) at least one monomer selected from acrylic acid esters, methacrylic acid esters and maleic acid esters and (b) a monomer represented by the following general formula (I):

In the formula (I), R represents a hydrogen atom or a methyl group, A represents —COO—, —O— or —CONH—, and Q represents an azo coupling residue which forms an azo dye by causing a coupling reaction with an o-quinonediazide compound under a basic environment.

Particularly preferable examples of Q include naphthols, acylacetamides, cyanoacetyls, β-keto esters, pyrazolones (for example, 1-aryl-3-amido-5-pyrazolones), homophthalimides, coumalanones, indoxyls, thioindoxyls, and imidazolones, etc.

The monomer component represented by the general formula (I) is contained in the copolymer in a range of 5 to 80% by weight, preferably 20 to 70% by weight. The average molecular weight of the copolymer is in a range of about 2,000 to about 200,000, preferably 8,000 to 100,000.

The above-described copolymers can be synthesized by, for example, a process described in U.S. Pat. No. 3,451,820. The amount of the coupling component to be contained in the light-sensitive layer is such an amount that the amount of coupling residue thereof is in a range of 0.05 to 10 equivalents, preferably 0.1 to 1.0 equivalent, per equivalent of the o-quinonediazide compound contained in the light-sensitive layer.

The silicone rubber layer used in the present invention is composed of linear organopolysiloxane having a molecular weight of 8,000 to 600,000 having the following repeating unit as a main component.

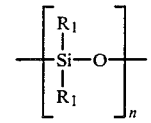

wherein n is an integer of 1 or more, preferably 1 to 10,000, and $R_1$ is an alkyl group having 1 to 10 carbon atoms, an alkenyl group or a phenyl group, and 60% or more of $R_1$ is preferably a methyl group. The most suitable substance is dimethylpolysiloxane wherein all of $R_1$ are methyl groups.

Silicone rubber is obtained by sparsely cross-linking the above-described linear organopolysiloxane.

In order to sparsely cross-link such linear organopolysiloxane, a silicone cross-linking agent is added. As the cross-linking agents, there are acetoxysilane, ketooximesilane, alkoxysilane, aminosilane, amidosilane and alkenyloxysilane, etc., which are used for the socalled room temperature (low temperature) hardening silicone rubber. They are generally combined with linear organopolysiloxane having end-hydroxyl groups to form silicone rubbers of the type of diacetic acid, deoxime, dealcohol, deamine, deamide and deketone (deacetone).

The cross-linking agent is used in an amount of 0.1 to 10 wt% based on the weight of the linear organopolysiloxane.

Particularly, the following silicone crosslinking agents are suitably used.

(1) $R_1-Si(OR_1)_3$ (dealcohol type)
(2) $R_1-Si(OAc)_3$ (deacetic acid type)
(3) $R_1-Si(ON=CR'_2)_3$ (deoxime type)
(4) $R_1-Si[OC(R')CH=CH_2]_3$ (deketone type)

wherein $R_1$ represents the same meaning as described above, $R'$ is an alkyl group such as methyl or ethyl, etc., and Ac is an acetyl group.

To the silicone rubber, a 0.5 to 5 wt% of an organotin compound, etc., is generally added as a catalyst based on the weight of the linear organopolysiloxane.

In the negative working dry PS plate of the present invention, since adhesion between the support and the light-sensitive layer and between the light-sensitive layer and the silicone rubber layer is very important for fundamental performances of the printing plates, such as the image reproduction property or printing durability, etc., an adhesive layer is provided between each layer as occasion demands or a component for improving adhesion may be added to each layer.

Various substances are used for the adhesive layer for the purpose of, particularly, adhesion between the light-sensitive layer and the silicone rubber layer, and an aminosilane layer is particularly preferred. The term "aminosilane" used herein means substances represented generally by the following formula:

$$R^2_o R^3_p Si(OR^4)_{4-o-p}$$

wherein $R^2$ is an alkyl group having an unsubstituted or substituted amino group, $R^3$ and $R^4$ are an alkyl group or an aryl group, o is 1 or 2, p is 0 or 1, and o+p=1 or 2.

Typical examples of them include 3-aminopropyltriethoxysilane, N-(2-aminoethyl)-3-aminopropyltrimethoxysilane, 3-aminopropyltrimethoxysilane, bis[3-(trimethoxysilyl)propyl]amine, bis[3-(trimethoxysilyl)propyl]-ethylenediamine, N-[3-(trimethoxysilyl)propyl]morpholine, trimethoxysilylpropyl diethylenetriamine, bis(2-hydroxyethyl)aminopropyltriethoxysilane, 3-aminopropylmethyldiethoxysilane, (N,N-diethyl-3-amino)propyltrimethoxysilane, (N,N-dimethyl-3-amino)propyltrimethoxysilane, N-methylaminopropyltrimethoxysilane, N-phenylaminopropyltrimethoxysilane, 1-trimethoxysilyl-2-(p-m-aminomethyl)-phenylethane and trimethoxysilylpropyl allylamine, etc.

Likewise, an organotitanate layer is preferred for the purpose of adhesion between the light-sensitive layer and the silicone rubber layer. The term: organotitanate used here means titanium type primers represented generally by the following formulae:

$Ti(OR^5)_4$,  or

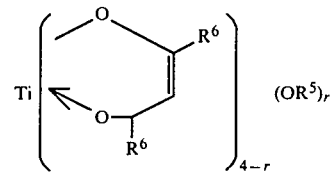

wherein $R^5$ and $R^6$ represent each alkyl, aryl, cycloalkyl or alkenyl, which are identical or different, and q and r are 0, 1 or 3.

Typical examples of them include tetraalkyl titanates such as tetraisopropoxy titanium, tetra-n-butoxy titanium, tetrastearoxy titanium, tetrakis(2-ethylhexyl)titanate, etc., titanium chelates such as dipropoxy-bis-(acetylacetonato)titanium, dibutoxy-bis-(acetylacetonato)titanium, dibutoxy-bis(triethanolaminato)titanium, dihydroxy-bis(lactato)-titanium, tetrakis(2-ethylhexanediolato)titanium, etc., titanium acylates such as tri-n-butoxy titanium monostearate, titanium tetrabenzoate, etc., and associated substances thereof and polymers thereof.

Thickness of the adhesive layer may be, in principle, more than that of the monomolecular layer, but a thickness in a range of 10 mμ to 2μ is chosen in the viewpoint of practical coating operation. If it is too thick, it not only causes economic disadvantages but also has a bad influence upon permeation of the development solution into the light-sensitive layer.

Likewise, various substances are added as adhesive components to the silicone rubber layer for the purpose of adhesion between the light-sensitive layer and the silicone rubber layer, and aminosilane or organotitanate is particularly suitably used. The terms: aminosilane and organotitanate are the same as described above.

The amount of aminosilane or organotitanate to be contained in the silicone rubber layer is selected between a range of 0.05 to 10% by weight, preferably 0.1 to 5% by weight.

Aminosilane and organotitanate may be used as a mixture of them or a mixture with other adhesive components.

The support should have flexibility capable of putting on a conventional lithographic printing press, etc., and endure a weight applied in the case of printing. Typical examples include metal plates such as aluminum, copper or steel, etc., plastic films or sheets such as polyethylene terephthalate, etc., coated papers and rubbers, etc.

Further, it is possible to use a composite support, a support having rubber elasticity, a support having a rubber elastic layer or a cylindric support.

It is possible to make a support by applying a coating to the above-described sheet material for the purpose of preventing halation or others.

In order to protect the silicone rubber layer-forming the surface of an image forming laminate constructed as described above, the surface of the silicone rubber may be laminated with a thin protective film or sheet of polyethylene terephthalate, polypropylene, polyethylene, polystyrene, polyvinyl chloride, polyvinylidene chloride or cellophane, etc., which is subjected to plane processing or uneven processing. The protective film is not particularly restricted and it may be removed prior to imagewise exposure. As a protective film capable for use in the case of imagewise exposure, there is a film composed of the above-described material which has a thickness of 100μ or less, preferably 30μ or less so that it has transparency capable of passing ultraviolet rays and prevents spoilage of the image fidelity in the case of exposure.

The layer construction of the negative working dry PS plate is as follows. Namely, it is composed of a support, a light-sensitive layer which may be provided, if necessary on an adhesive layer or a primer layer, a silicone rubber layer which may be provided, if necessary, on an adhesive layer, and, if necessary, a protective layer. It is preferred that the thickness of the light-sensitive layer is in a range of 0.05 to 3μ and that of the silicone rubber layer is in a range of 0.5 to 10μ. The silicone rubber layer is generally preferred to have a thickness of 1.0 to 3.0μ, because it is preferred to be as thin as possible from the viewpoint of tone reproduction but, it is necessary to have a certain degree of thickness from the viewpoint of printing durability and printing stain. The primer layer and the adhesive layer are preferred to be as thin as possible within the scope of sufficiently showing their function.

The negative working dry PS plate of the present invention is subjected to development processing after imagewise exposure to remove only the silicone rubber layer in the exposed part or both the silicone rubber layer and the light-sensitive layer, and processing with base is carried out at arbitrary stage after imagewise exposure. By carrying out processing with base, the o-quinonediazide compound in the non-exposed part causes a coupling reaction with the coupling component to lose sensitivity, and, consequently, the non-image part does not change even if exposed to light after plate making.

As light sources for imegewise exposure, for example, superhigh pressure mercury lamps, carbon arc lamps, metal halide lamps, xenon lamps, chemical lamps, fluorescent lamps and sunlight, etc., are used.

As developing solutions used in the present invention, those known as developing solutions for negative working dry PS plate can be used. For example, aliphatic hydrocarbons (hexane, heptane Iso Par E, H or G" (trademark of aliphatic hydrocarbons produced by Exxon), gasolin or kerosene, etc.), aromatic hydrocarbons (toluene or xylene, etc.) and halogenated hydrocarbons (trichlene, etc.) to which the following polar solvents are added are suitably used.

Alcohols (methanol, ethanol, water, etc.).
Ethers (methyl cellosolve, ethyl cellosolve, butyl cellosolve, methyl carbitol, ethyl carbitol, butyl carbitol, dioxane, etc.).
Ketones (acetone, methyl ethyl ketone, etc.).
Esters (ethyl acetate, methyl cellosolve acetate, cellosolve acetate, carbitol acetate, etc.).

Development and dyeing of the primer layer can be carried out at the same time by adding dyes such as Crystal Violet, Astrazone Red, etc., to the developing solution.

Development can be carried out by known methods, for example, by rubbing with a pad for development containing the above-described developing solution or by rubbing with a developing brush after pouring the developing solution on the surface of the plate. Thus, the silicone rubber layer or both the silicone rubber layer and the light-sensitive layer of the exposed part are removed to expose the surface of the light-sensitive layer, the primer layer or the support, which becomes an ink receiving part.

The base used for processing with base in the present invention means any base conventionally used in the chemical field, and which is defined as proton acceptor or electron donator. As the base, any inorganic base and organic base may be used. Examples are as follows.

As organic bases, organic bases having 1 to 30 carbon atoms (including ammonia, hydrazine, and hydroxylamine as exceptions) are suitably used. For example, amino compounds (primary, secondary, and tertiary amines, monoamine, diamine, triamine and tetramine to polyamine, aliphatic chain amines, aliphatic cycloamines, aromatic amines and heterocyclic amines), amine derivatives such as acid amide, and salts of amine and carboxylic acid (for example, salts of octanoic acid, etc., and ethanolamine or diethanolamine, etc.), etc., are used, examples of which include ammonia (ammonium hydroxide), methylamine, ethylamine, dimethylamine, diethylamine, trimethylamine, triethylamine, propylamine, butylamine, amylamine, dipropylamine, dibutylamine, diamylamine, tripropylamine, tributylamine, methyldiethylamine, ethylenediamine, trimethylenediamine, tetramethylenediamine, polyethyleneimine, benzylamine, N,N-dimethylbenzylamine, N,N-diethylbenzylamine, N,N-dipropylbenzylamine, o-, m- or p-methoxy or methylbenzylamine, N,N-di(methoxybenzyl)amine, $\beta$-phenylethylamine, $\epsilon,\delta$-phenylamylamine, $\gamma$-phenylpropylamine, cyclohexylamine, aniline, monomethylaniline, dimethylaniline, toluidine, benzidine, $\alpha$- or $\beta$-naphthylamine, o-, m- or p-phenylenediamine, pyrrolidine, piperidine, piperazine, morpholine, urotropin, diazabicycloundecane, pyrrole, pyridine, quinoline, hydrazine, phenylhydrazine, N,N'-diphenylhydrazine, hydroxylamine, urea, semicarbazide, thiourea, lysine, histidine, quinine, brucine, caffeine, cinchonine, cocaine, strychnine, tetraalkylammonium hydroxide, aminobenzoic acid, formamide, acetamide, N,N-dimethylformamide, N,N-dimethylacetamide, acetanilide, monoethanolamine, diethanolamine, triethanolamine, 2-(2-aminoethyl)ethanol, 2-amino-2-methyl-1,3-propanediol, 2-amino-1,3-propanediol, 2-amino-2-hydroxymethyl-1,3-propanediol, etc.

Further, alkali metal alcoholates such as sodium methylate, sodium ethylate, sodium propylate, potassium methylate, potassium ethylate, potassium propylate, lithium methylate, lithium ethylate, etc., and alkali metal amides such as amide, ethylamide or dipropylamide of sodium, potassium or lithium, etc., can be used.

As inorganic bases, hydroxides, carbonates, etc., of alkali metals and alkaline earth metals, such as sodium hydroxide, potassium hydroxide, lithium hydroxide, calcium hydroxide, barium hydroxide, sodium carbonate, potassium carbonate, lithium carbonate, calcium carbonate, barium carbonate, sodium hydrogencarbonate, potassium hydrogencarbonate, potassium cyanide, sodium cyanide, sodium phosphate, potassium phosphate, sodium silicate, potassium silicate, sodium metasilicate, etc., are used.

Further, bases in a masked state, for example, salts of acid such as carboxylic acid, phosphoric acid, etc., and alkali metal or alkaline earth metal, can be used.

Of these bases, organic bases are particularly preferred and amine compounds are more preferred. These bases are used alone or as a mixture, in a state of liquid or gas. In the case of a liquid, for example, the base is used as it is or in a state of solution. In the case of a solution, the solvent may be any of water, organic solvents and mixtures thereof. It may be used together with the developing solution.

The amount of the base to be used is not simply determined in any case of processing in a gas phase and a liquid phase. In the case of low concentration of the base, in order to exhibit the effect of it, the processing is carried out for a long time under such a condition that a sufficient amount of the base is fed, and, in the case of high concentration, the processing is carried out for a short time. Thus, the concentration is not particularly restricted in the case of using as a solution. From the viewpoint of strength of the base, easiness of operation, safety or practical processing time, it is used in a concentration ranging from 50% to 0.01%, preferably 30-40% to 0.1%, in the case of the gas phase, and a concentration ranging from 100% to 0.001%, preferably 50% to 0.01%, in the case of the liquid phase, by which a sufficient effect is obtained.

The time for processing with base is not particularly restricted and it can be suitably selected according to strength and concentration of the base. Usually, the effect instantly appears by touching with the processing solution, and the effect does not change by touching with it for a long time. Ordinarily, a time of about 2 or 3 seconds to 30 minutes is used.

In the case of processing in a liquid state, the printing original plate may be immersed in a base or a solution of a base, or the surface of the plate may be damped with the base or the solution of the base. In the case of processing in a gas phase, the surface of the plate may be exposed to a gas phase containing the base.

The processing with base, as described above, may be carried out at any stage after imagewise exposure, namely, before development, after development or simultaneously with development. In the case of carrying out the processing with base simultaneously with development, the base is incorporated in the developing solution. In this case, bases easily dissolving in the developing solution (for example, amine compounds) are advantageously used.

To carry out the processing with base prior to development or simultaneously with development is advantageous, because there is an effect that the adhesive strength between the light-sensitive layer of the non-exposed part (non-image part) and the silicone rubber layer thereon increases to remarkably improve solvent resistance of the non-image part and, consequently, the development latitude (variation of development conditions such as development time, etc., allowed for giving the same development result) expands. Above all, the process of processing with base simultaneously with development is particularly preferred, because the processing steps are simplified.

The lithographic printing plate requiring no dampening solution produced according to the procedure as described above is mounted on a printing press, by which printing can be carried out without feeding dampening solution.

The negative working dry PS plate according to the present invention can give a lithographic printing plate requiring no dampening solution having a fixed non-image part without carrying out prior complicated steps such as fixation by heating. Namely, in the lithographic printing plate requiring no dampening solution according to the present invention, the light-sensitive layer of the non-image part causes a coupling reaction by processing with the base to lose its sensitivity and, further, the adhesive strength between the silicone rubber layer and the light-sensitive layer is improved. Accordingly, the light-sensitive layer does not change any longer if the non-image part is exposed to light after plate making. Consequently, the silicone rubber layer of the non-image parts does not come off even if it touches processing agents such as plate cleaner, etc., and the number of prints having good quality can be obtained. In addition, since a coloring dye is formed by the coupling reaction in the light-sensitive layer of the non-image part, the image part and the non-image part can be visually discriminated.

In the following non-limiting examples, the present invention is illustrated in greater detail. Unless otherwise stated, % means % by weight.

EXAMPLE 1 AND COMPARATIVE EXAMPLE 1

An aluminum plate having a thickness of 0.24 mm was degreased by processing with a 20% aqueous solution of sodium tertiary phosphate at 60° C. for 2 minutes and washed well with water. This aluminum plate was then processed with a 3% aqueous solution of JIS No. 3 sodium silicate at 70° C. to produce a support. A solution prepared by dissolving 1 part by weight of Toray Silicone Primer SH-6020 [N-$\beta$-(aminoethyl)-$\gamma$-aminopropyltrimethoxysilane] in 500 parts by weight of methanol was applied to the above-described support and dried at 100° C. for 1 minute to form a primer layer. To the resulting aluminum support having a coated primer layer, a light-sensitive solution having the following formulation was applied so as to result in a dry weight of 1.0 g/m$^2$ and dried.

|  | parts by weight |
| --- | --- |
| 2-Diazo-1-naphthol-5-sulfonic acid ester of polyhydroxyphenyl obtained by polycondensation of acetone and pyrogallol (compound described in U.S. Pat. No. 3,635,709) | 8.5 |
| High polymer compound having the following formula (I) (average molecular weight: about 10,000) | 1.5 |
| Methyl cellosolve acetate | 120 |
| Methyl ethyl ketone | 60 |
| (I) | |

$$\begin{array}{c} CH_3 \\ | \\ \{CH_2-C\}_{30}-\{CH_2-CH\}_{70}- \\ | \quad\quad\quad | \\ C=O \quad\quad C=O \\ | \quad\quad\quad | \\ NH \quad\quad\quad OC_2H_5 \end{array}$$

(structure with triazole/diazo coupling group bearing 2,4,6-trichlorophenyl)

A solution prepared by dissolving 1 part by weight of a silane coupling agent SH-6020 [N-$\beta$-(aminoethyl)-$\gamma$-aminopropyltrimethoxysilane] produced by Toray Silicone Co. in 500 parts by weight of toluene was filtered and applied to the above-described light-sensitive layer, and a solution prepared by dissolving 9 parts by weight of Shinetsu Silicone KE41T (one liquid type RTV deacetic acid type), 3,3 parts by weight of Shinetsu Silicone KS709 (two liquid type releasing silicones) and 0.04 part by weight of a catalyst: CAT-PS (produced by Shinetsu Chemical Co.) in 150 parts by weight of Iso Par G (produced by Exxon Chemical Co.) was then applied so as to result in a dry weight of 2 g/m². After drying at 100° C. for 2 minutes, it was allowed to stand in the dark for a night to conclude hardening. On the resulting negative working dry PS plate, a negative transparency and a step tablet (having 15 steps wherein the transmission optical density of the first step was 0.05, and differences of optical densities were 0.15) were put in close contact, and the plate was exposed to light for 60 seconds by a vacuum printer produced by BTC ASCOR Co. When the plate was rubbed with a Haneylon lithopad (Honey Fiber Bedding Corp.) impregnated with a developing solution composed of 3 parts by weight of ethylenediamine, 50 parts by weight of ethyl alcohol and 50 parts by weight of Iso Par G for 5 minutes, the light-sensitive layer of the exposed part and the silicone rubber layer thereon were removed. On the other hand, the light-sensitive layer of the non-exposed part was colored in brown and the silicone rubber layer on it remained without any change. The reason why the light-sensitive layer was colored in brown is that o-quinonediazide and the compound represented by the formula (I) caused coupling in the presence of the base, namely, ethylenediamine. Further, the silicone rubber layer of the 3rd step or more in the step tablet exposed at the same time remained intact.

After the entire surface of the above-described printing plate was exposed to light for 60 seconds by the above-described printer, the surface of the plate was rubbed with a Hoenylon lithopad impregnated with ethyl alcohol for 1 minute, but changes in the step tablet was not observed. Namely, it was confirmed that the non-image part was fixed.

On the other hand, for comparison, the negative working dry PS plate used in Example 1 was exposed to light together with a step tablet by a vacuum printer for 60 seconds and developed for 5 minutes with the developing solution of Example 1 from which ethylenediamine was removed, namely, a developing solution composed of 50 parts by weight of ethyl alcohol and 50 parts by weight of Iso Par G. The silicone rubber layer of the 6th step or more remained intact and the light-sensitive layer was not colored at all. After the entire surface of this plate was exposed to light for 60 seconds by the vacuum printer, it was rubbed with a Hoenylon lithopad impregnated with ethyl alcohol for 1 minute. The light-sensitive layer and the silicone rubber layer were completely removed from the support. Namely, the non-image part was not fixed.

EXAMPLE 2

A negative working dry PS plate was produced by the same manner as in Example 1, except that the following formulation was used for the light-sensitive layer.

|  | parts by weight |
|---|---|
| 2-Diazo-1-naphthol-5-sulfonic acid ester of polyhydroxyphenyl obtained by polycondensation of acetone and pyrogallol (compound described in U.S. Pat. No. 3,635,709) | 7.0 |
| High polymer compound having the structure represented by the above described formula (I) | 3.0 |
| Methyl cellosolve acetate | 120 |
| Methyl ethyl ketone | 60 |

After this plate was exposed to light for 60 seconds together with a step tablet by a vacuum printer, it was developed with a developing solution composed of 3 parts by weight of ethylenediamine, 50 parts by weight of ethyl alcohol and 50 parts by weight of Iso Par G for 3 minutes. The non-exposed part of the light-sensitive layer was colored in brown similarly to the case of Example 1.

When this plate was put on a printer GTO produced by Heidelberg Co. and printing was carried out without feeding the dampening solution, 5,000 sheets or more of prints having no stain could be obtained.

After the entire surface of the developed plate was exposed to light for 60 seconds by the same vacuum printer as in Example 1, it was rubbed with a Hoenylon lithopad impregnated with ethyl alcohol, but the light-sensitive layer and the silicone rubber layer on it did not suffer any damage.

EXAMPLE 3 AND COMPARATIVE EXAMPLE 2

In Example 3, the same plate as in Example 2 was used. In Comparative Example 2, the same plate as in Example 2 was produced, except that the following light-sensitive layer was used.

|  | parts by weight |
|---|---|
| 2-Diazo-1-naphthol-5-sulfonic acid ester of polyhydroxyphenyl obtained by polycondensation of acetone and pyrogallol (compound described in U.S. Pat. No. 3,635,709) | 10 |
| Methyl cellosolve acetate | 120 |
| Methyl ethyl ketone | 60 |

Plates of Example 3 and Comparative Example 2 were each brought in contact with a negative film and a step tablet and exposed to light for 20 seconds by a vacuum printer. After exposure, when development was carried out by rubbing the surface of the plate with a Hoenylon lithopad impregnated with a developing solution composed of 75 parts by weight of ethyl alcohol and 25 parts of Iso Par G, development of the plate of Example 3 was finished within 5 minutes, while development of the plate of Comparative Example 2 was finished within 3 minutes. Silicone rubber remained in the 6th step or more of the step tablet in the plate of Example 3, and the silicone rubber remained in the 5th step or more in the plate of Comparative Example 2.

After conclusion of development, the two plates were immersed in a processing solution composed of 3 parts by weight of ethylenediamine and 97 parts by weight of ethyl alcohol for 1 minute, followed by washing with water and drying. After the entire surface of these two plates was exposed to light for 40 seconds by a vacuum printer, the plate of Example 3 was rubbed for 5 minutes and the plate of Comparative Example 2 was rubbed for 3 minutes with a Honeylon lithopad impregnated with a developing solution composed of 75 parts by weight of ethyl alcohol and 25 parts by weight of Iso Par G. As a result, in the plate of Example 3, the light-sensitive layer and the silicone rubber layer hardly suffered any damage, and the step number in the step tablet hardly changed. On the other hand, in the plate of Comparative Example 2, almost all of the halftone image part were removed from the support, and only the light-sensitive layer and the silicone rubber layer of the 5th step to the 7th step in the step tablet remained on the support and the light-sensitive layer and the silicone rubber layer of the 8th step or more in the step tablet were removed. It is understood from these results that the plate of Example 3 was fixed by causing a coupling reaction, but the plate of Comparative Example 2 was not fixed because the coupling reaction did not occur because no coupler was employed.

While the invention has been described in detail and with reference to specific embodiments thereof, it will be apparent to one skilled in the art that various changes and modifications can be made therein without departing from the spirit and scope thereof.

What is claimed is:

1. A plate making process which comprises the steps of:
   (i) imagewise exposing a negative working light-sensitive lithographic plate requiring no dampening solution to light so as to obtain an exposed part and a non-exposed part, wherein said plate comprises a support having in sequence thereon,
   (A) a light-sensitive layer containing, in admixture,
      (1) an o-quinonediazide compound; and (2) a coupling component which causes a diazo coupling reaction with said o-quinonediazide compound under a basic environment,
   wherein said coupling component is employed in an amount that the amount of coupling residue thereof is in a range of 0.05 to 10 equivalents per equivalent of the o-quinonediazide compound contained in the light-sensitive layer, wherein the o-quinonediazide is employed in an amount of from 30 to 95 wt% based on the total weight of the light-sensitive layer and wherein said coupling component comprises polymers having coupler residues in the side chains thereof, wherein said polymers are copolymers composed of (a) at least one monomer selected from acrylic acid esters, methacrylic acid esters and maleic acid esters and (b) a monomer represented by formula (I) below:

$$CH_2=C-A-Q \quad (I)$$
   with R above C wherein R is a hydrogen atom or methyl group, A is —COO—, —O— or —CONH—, and Q is an azo coupling residue which forms an azo dye by causing a coupling reaction with an o-quinonediazide compound under a basic environment, and
   (B) a silicone rubber layer,
   (ii) developing the resulting imagewise exposed plate with a developer so as to remove only the silicone rubber layer or both the silicone rubber layer and the light-sensitive layer of the exposed part and thus expose the surface of the light-sensitive layer, a primer layer or the support so as to obtain a lithographic plate requiring no dampening solution, and
   (iii) at any stage after imagewise exposure, treating said plate with a sufficient amount of basic compound such that the o-quinonediazide compound in the non-exposed part causes a coupling reaction with the coupling component and as a result the non-exposed part does not change even if exposed to light after plate making.

2. The plate making process as claimed in claim 1, wherein said an o-quinonediazide compound is selected from the group consisting of o-quinonediazide sulfonic acid ester obtained by a condensation reaction with a hydroxy group containing compound and an o-quinonediazide sulfonic acid amide obtained by condensing with an amine.

3. The plate making process as claimed in claim 1, wherein said coupling component is employed in such an amount that the amount of coupling residue thereof is in a range of 0.1 to 1.0 equivalent per equivalent of the o-quinonediazide compound contained in the light-sensitive layer.

4. The plate making process as claimed in claim 1, wherein said silicone rubber layer is composed of a linear organopolysilocane having the following repeating unit as a main component:

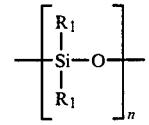

wherein n is an integer of 1 or more, and $R_1$ is an alkyl group having 1 to 10 carbon atoms, an alkenyl group or a phenyl group, and 60% or more of $R_1$ is a methyl group.

5. The plate making process as claimed in claim 1, wherein the thickness of said light-sensitive layer is in the range of 0.5 to 3 microns and that of the silicone rubber layer is in the range of 0.5 to 10 microns.

6. The plate making process as claimed in claim 5, wherein said silicone rubber layer has a thickness of 1.0 to 3.0 microns.

* * * * *